United States Patent [19]
Tomura et al.

[11] Patent Number: 5,521,639
[45] Date of Patent: May 28, 1996

[54] SOLID-STATE IMAGING APPARATUS INCLUDING A REFERENCE PIXEL IN THE OPTICALLY-BLACK REGION

[75] Inventors: Masaharu Tomura, Kanagawa; Kikue Shimokawa, Tokyo, both of Japan

[73] Assignee: Sony Corporation, Tokyo, Japan

[21] Appl. No.: 314,199

[22] Filed: Sep. 28, 1994

Related U.S. Application Data

[63] Continuation-in-part of Ser. No. 45,126, Apr. 12, 1993, abandoned.

[30] Foreign Application Priority Data

Apr. 30, 1992 [JP] Japan ................................ 4-135703

[51] Int. Cl.$^6$ .................................................. H04N 3/14
[52] U.S. Cl. ........................................... 348/243; 348/245
[58] Field of Search ................................. 348/243, 241, 348/245, 294; 257/223, 229

[56] References Cited

U.S. PATENT DOCUMENTS

| | | | |
|---|---|---|---|
| 4,293,877 | 10/1981 | Tsunekawa et al. | 348/243 X |
| 4,533,169 | 11/1985 | Yoshioka et al. | 348/243 X |
| 4,644,403 | 2/1987 | Sakai et al. | 257/223 |
| 5,455,624 | 10/1995 | Ishike et al. | 348/243 X |

*Primary Examiner*—Wendy R. Greening
*Attorney, Agent, or Firm*—William S. Frommer; Alvin Sinderbrand

[57] ABSTRACT

Solid-state imaging apparatus for producing an image signal has an active pixel region comprised of a plurality of active light receiving pixels for converting incident light to an image signal, and an optical black region disposed at the peripheral portion of the active pixel region and comprised of a plurality of pixels having a surface provided with a light shield. At least one pixel in the optical black region is located at a predetermined position and produces a position reference signal of a level which differs from that produced by the remaining pixels in the optical black region.

7 Claims, 6 Drawing Sheets

SOLID-STATE IMAGING APPARATUS INCLUDING A REFERENCE PIXEL IN THE OPTICALLY-BLACK REGION

This is a continuation-in-part of application Ser. No. 08/045,126, filed Apr. 12, 1993 now abandoned.

BACKGROUND OF THE INVENTION

This invention relates to a solid-state imaging apparatus, and more particularly, to a solid-state imaging apparatus including an active pixel region comprised of a plurality of active light receiving pixels to produce output signals as a function of impinging light and an optical black region arranged at the periphery of the active pixel region and comprised of a plurality of pixels which are effectively non-responsive to impinging light.

In a solid-state imaging apparatus using CCDs (Charge Coupled Devices), when signal processing is carried out for every light image pickup element, or pixel (cell), for example, when correcting for a defective pixel, or providing digital shading correction, etc., a timing signal from a timing generator is used as a pixel position reference signal. In a so-called self-contained video camera, the timing generator is included in a camera control circuit which is contained, or housed, in the camera body.

A non-self-contained video camera is formed of a camera head unit which includes an optical system, an imaging section which is comprised of the pixels, etc., and a separate camera control unit (CCU) for controlling the operation of the video camera. A measurable time delay is imparted to the transmission of a video signal from the camera head unit to the camera control unit, giving rise to a delay of the video signal. Likewise, a timing signal from the timing generator in the CCU, and which is supplied to the camera head unit for the purpose of driving the CCDs, undergoes a delay. Such delays often are changeable as a function of temperature, age and other factors, and thus are unpredictable. For this reason, it is difficult, if not impossible, simply to use a signal from the timing generator as a pixel position reference signal. Although it is conceivable to use the horizontal synchronizing signal as a reference, it is difficult to insure the accuracy thereof for use as a reference it for an individual pixel.

OBJECTS OF THE INVENTION

Therefore, an object of this invention is to provide a solid-state imaging apparatus adapted for outputting a pixel position reference signal together with an image signal.

Another object of this invention is to provide apparatus for detecting and compensating for a defective pixel in a CCD pickup unit.

Various other objects, advantages and features of the present invention will become readily apparent from the following detailed description and the novel features will be particularly pointed out in the appended claims.

SUMMARY OF THE INVENTION

In accordance with this invention, a solid-state CCD video imaging apparatus comprises an active pixel region formed of a plurality of active light receiving elements, or pixels, for converting incident light to a video signal, and an optical black region disposed at the periphery of the active pixel region and comprised of a plurality of pixels on whose surface is provided a light shield or light screen. A predetermined pixel within the optical black region is caused to generate a pixel position reference signal whose level differs from the level of the output signals produced by the other pixels in the optical black region. As a result, when the active and optical black regions are scanned during normal operation of the CCD apparatus, both the image signal and the pixel position reference signal are produced. If an active pixel is defective, the signal produced by that pixel is compensated.

DETAILED DESCRIPTION OF PREFERRED EMBODIMENTS

Preferred embodiments of this invention will now be described with reference to the attached drawings.

FIG. 1A illustrates the configuration of an embodiment of a solid-state CCD imaging apparatus according to this invention and FIG. 1B schematically illustrates the signals produced by that apparatus.

FIG. 1A includes an active pixel region 11 formed of a plurality of pixels 12 arranged in a two-dimensional matrix extending lengthwise and breadthwise. Light irradiated through a lens system (not shown) is effectively received in region 11 to produce output image signals at each pixel. An optical black region extends over the right side portion 15H and the lower side portion 15V around the periphery of active pixel region 11. This optical black region is such that incident light is blocked from impinging thereon; for example, an aluminum film is deposited and formed on the surface thereof as a light shield or light screen (referred to herein as a shield). No light is detected in the optical black region, and a signal having a predetermined black level (optical black level) is thus outputted therefrom at all times.

In accordance with this invention, a predetermined number of position reference pixels 16 are disposed at predetermined positions within the optical black region 15 to output a signal of a fixed level which is different from the optical black level. In the example of FIG. 1A, a single horizontal position reference pixel 16H is provided at the right side portion 15H within the optical black region 15 and a single vertical position reference pixel 16V is provided at the lower side portion 15V within the same region.

FIG. 1B is illustrative of an example of an output video signal waveform produced when a line (scanning line) of pixels including the horizontal position reference pixel 16H is scanned. The time period $T_A$ of this waveform corresponds to the time period during which the pixels in the active pixel region 11 are scanned, and the time period $T_B$ thereof corresponds to the time period during which the right side portion 15H of the optical black region 15 is scanned. The signal produced during this time period $T_B$ exhibits a predetermined optical black level $V_{BK}$. However, when the horizontal position reference pixel 16H is scanned, a pulse $R_H$ is generated at a level different from the optical black level $V_{BK}$. The detection of this pulse level $R_H$ is used as a pixel reference position signal.

Since the pixel reference position signal is derived from the video signal itself, that is, from the image signals produced by the CCD imaging apparatus, even if a delay is imparted to the transmission of the image signals from the camera head unit to the camera control unit, as is expected in a non-self-contained video camera, there is no difficulty in using the pulse $R_H$ as a reference signal because this reference signal undergoes the same delay as the active portion (or image information portion) of the image signal. Hence, video information from particular pixels referenced to this position reference pixel may be sensed with high accuracy.

While the horizontal position refrence pixel 16H is used as a reference position in the horizontal direction, vertical position reference pixel 16V may be used as a reference position in the vertical direction.

The above-mentioned position reference pixel 16H or 16V may be located at any desired position in the horizontal or vertical direction within the optical black region 15. Hence, when the operating parameters for the video camera timing generator are being selected, as during the manufacture thereof, the coordinates of the position reference pixels may be freely set. In order to output a signal of a fixed level, such as $R_H$, which can be readily discriminated from the optical black level $V_{BK}$ when the position reference pixel 16H or 16V is scanned, it is proposed to remove the light shield (such as the aluminum film or the like) normally deposited on the pixels in the optical black region, to thereby open a window only at the reference position in this portion. Another proposal for the position reference pixel is to provide a light emitting element, such as an element capable of emitting an infrared ray or the like, formed on a chip disposed opposite the usual light receiving section (sensor section) of the position reference pixel; and to form a light shield, such as the usual aluminum film, so that no external light impinges onto the position reference pixel except for the light that is emitted by the light emitting chip. When using such a light emitting chip, it is appreciated that suitable precautions should be taken to obviate, or at least minimize, the transmission, leakage, or diffraction of light onto other portions of the optical black region from the light emitting chip.

As a further proposal, the position reference pixel may be constructed to produce a larger dark current (dark current quantity) from the light receiving section (sensor section) thereof by omitting from the position reference pixel the positive hole storage layer normally overlying the n+ region of the sensor section. As a result, the surface state is in correspondence with a depleted state only at the position reference pixel in the optical black region. Reference is made to the solid-state imaging apparatus described in "High Sensitivity Interline type CCD of minimum illuminance 51x" Nikkei Micro Device, October, 1987, pp. 60–67.

Figure 1:
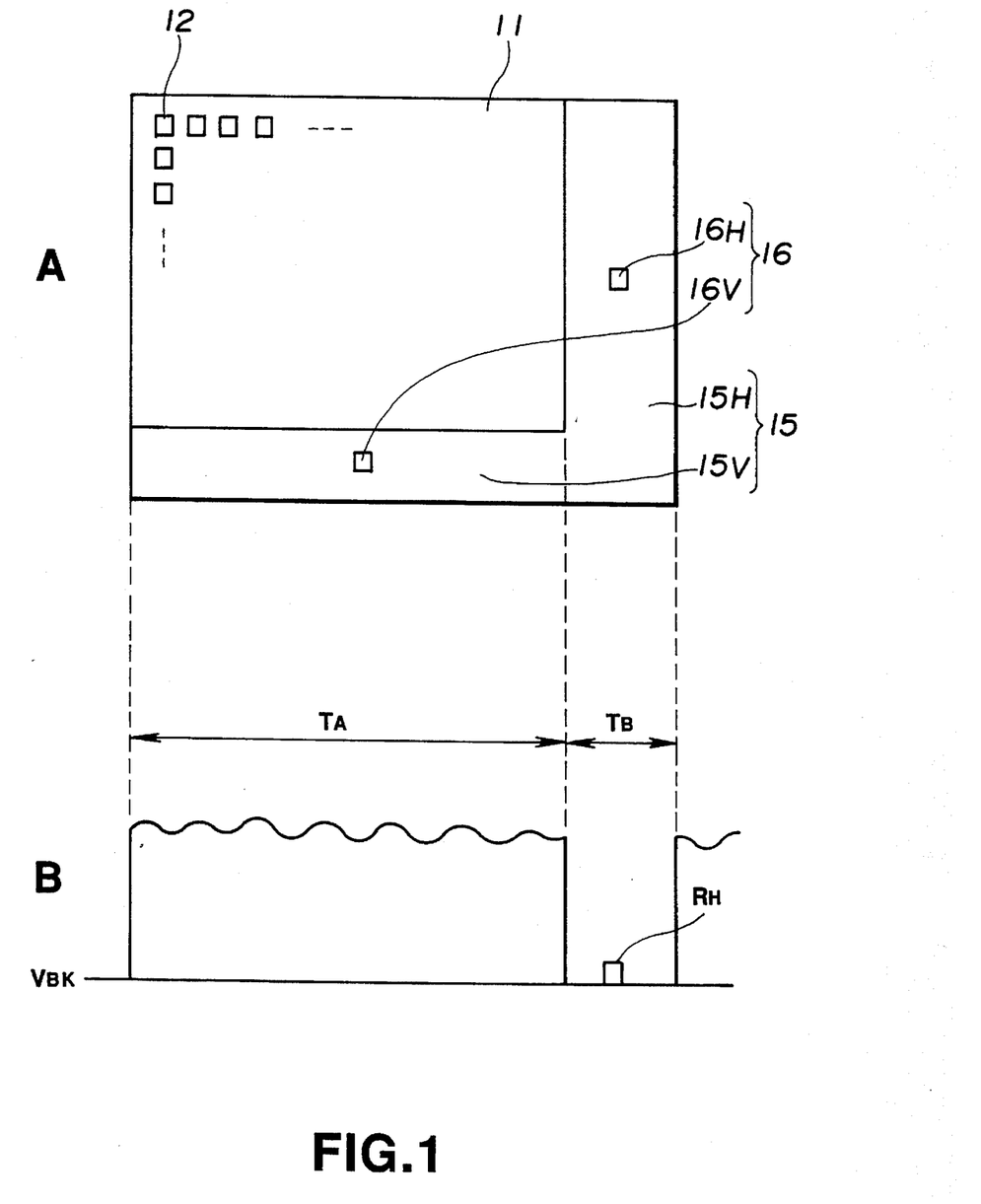
FIG. 1A is a schematic diagram showing an embodiment of a solid-state CCD imaging apparatus according to this invention.
FIG. 1B schematically represents the output signals produced by a row of pixels in FIG. 1A.
Figure 2:
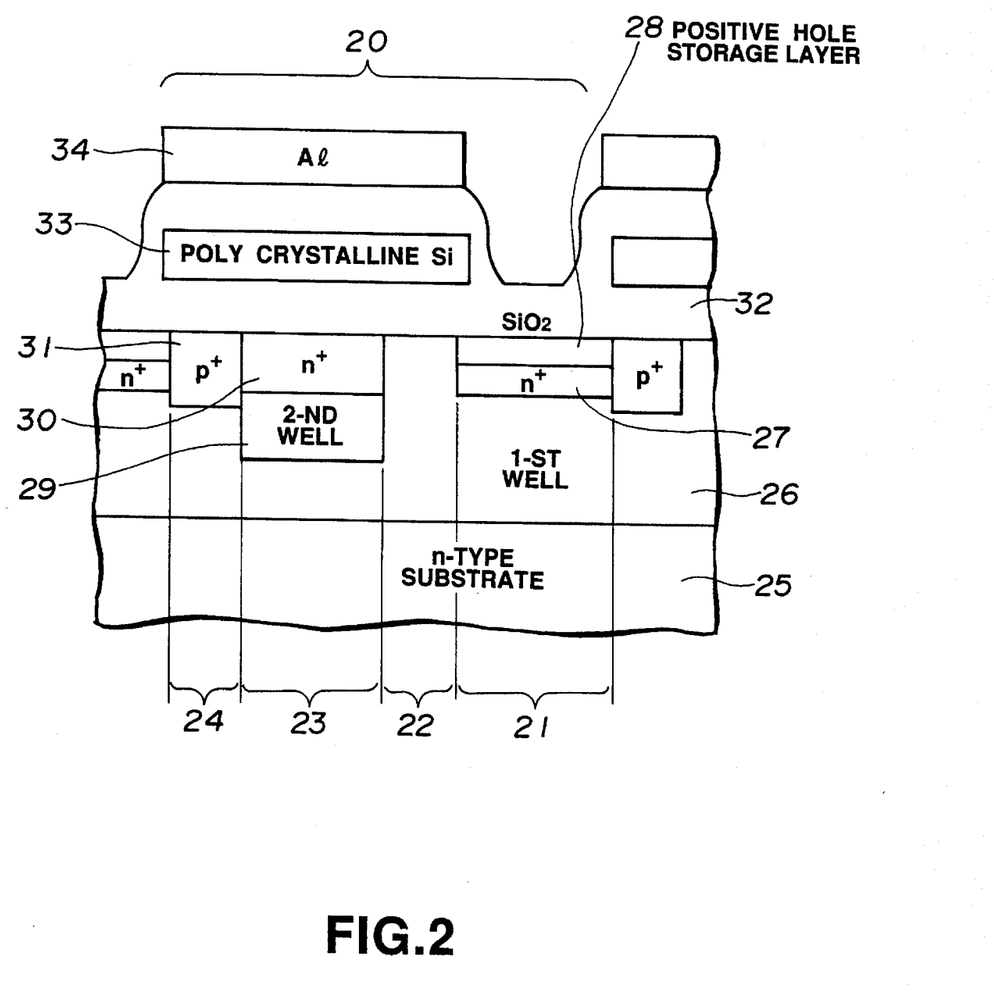
FIG. 2 is a schematic cross-sectional view for explaining the structure of an active pixel of the solid-state imaging apparatus shown in FIG. 1.

An active pixel adapted to be used in active pixel region 11 of FIG. 1A is described in the above-mentioned literature and is schematically illustrated herein in FIG. 2. This active pixel is adapted to store positive holes on the surface of a substrate to thereby suppress the dark current which otherwise would be generated. The structure of a single pixel 20 is comprised of a light receiving section (sensor section) 21, a readout gate 22, a vertical register 23, and a channel stopper 24. A first p-well region 26 is formed on an n-type silicon substrate 25. An $n^+$ region 27 is formed at the sensor section 21 within the p-well region 26. Further, a positive hole storage layer 28 is formed above the $n^+$ region 27.

In the vertical register 23, a second p-well region 29 is formed within the first p-well region 26, and an $n^+$ region 30 is formed above the second p-well region 29. The channel stopper 24 is comprised of a $p^+$ region 31 formed above the p-well region 26.

A $SiO_2$ film 32 is formed as an insulating layer by depositing same on the upper surface of $n^+$ region 30, p-well region 26, positive hole storage layer 28 and $p^+$ region 31. A polycrystalline Si layer 33 serving as an electrode is formed in the $SiO_2$ film so as to cover the readout gate 22, the vertical register 23 and the channel stopper 24 through the $SiO_2$ insulating layer. Further, an Al (aluminum) layer 34 is deposited on the upper surface of the $SiO_2$ insulating layer and serves as a light shield. That portion of the Al layer 34 which overlies sensor section 21 is removed to permit light to pass through the transparent $SiO_2$ layer.

In general, solid-state imaging devices, whether they exhibit high or low sensitivity, admit of a problem when imaging is carried out at low luminance because of the dominant fixed pattern noise attributed to dark current rather than light shot noise. To improve the sensitivity of the imaging device, the absolute value of the dark current is reduced.

Dark current includes, as a main component, a diffusion current which flows into the pixel from the substrate or the neutral region, a current produced as a result of the surface state of the sensor section and a current produced as a result of the surface state of the vertical register section. In order first to reduce the current component (i.e. electrons) which flows into the pixel by diffusion from the substrate, the p-well region 26 is formed on the n-type substrate 25 so as to particularly allow the p-well region to operate in a depleted state, thus to substantially completely suppress the diffusion component from the neutral region. With respect to the current produced on the surface of the sensor section, positive hole storage layer 28 allows positive holes to be stored and thereby suppress this current, as described more particularly in U.S. patent application Ser. No. 08/34,784. The current produced on the surface of the vertical register section is also suppressed in accordance with a similar principle. Positive holes are stored by a voltage applied to the gate electrode (the polycrystalline Si layer 33), thus to reduce the absolute value of that component of the dark current produced from the surface of the vertical register section 23.

Figure 3:
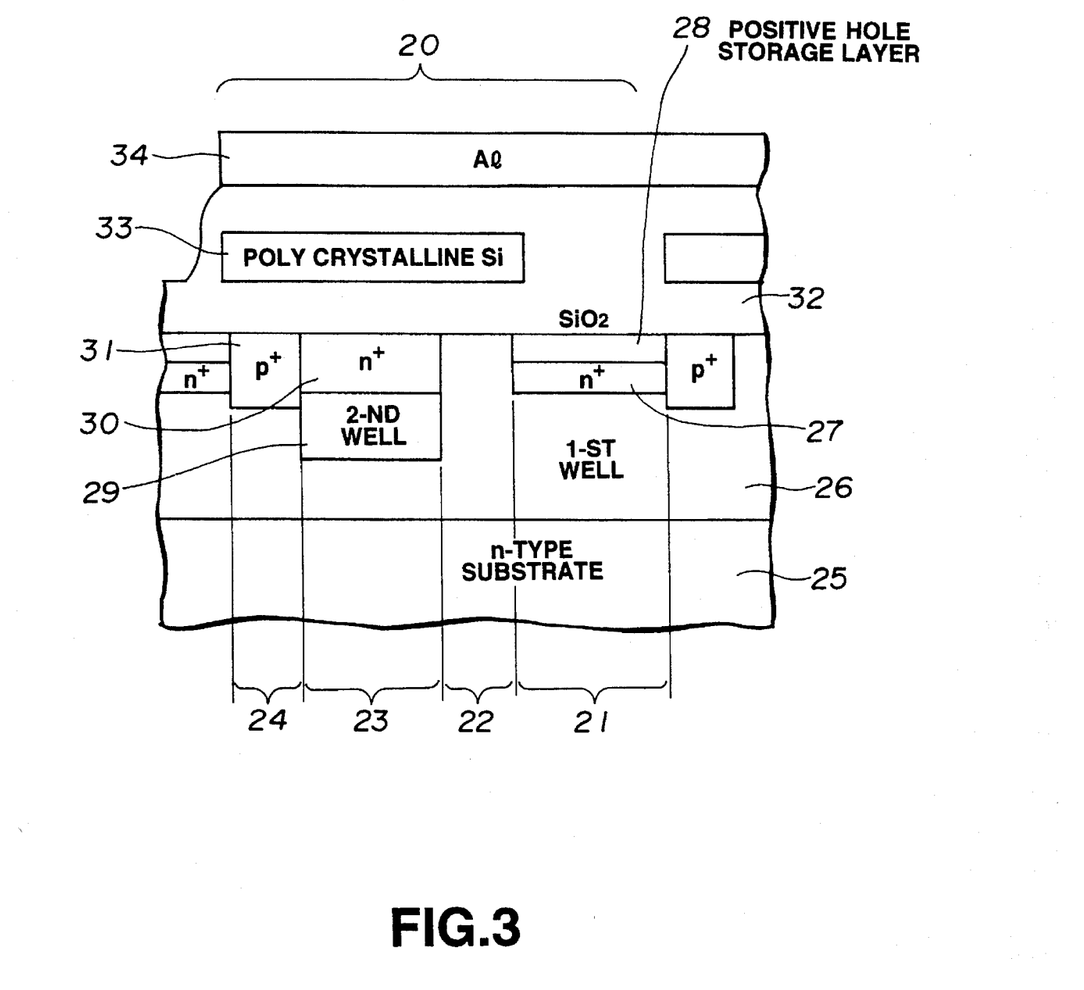
FIG. 3 is a schematic view of the structure of a pixel in the optical black region of the imaging apparatus.
Figure 4:
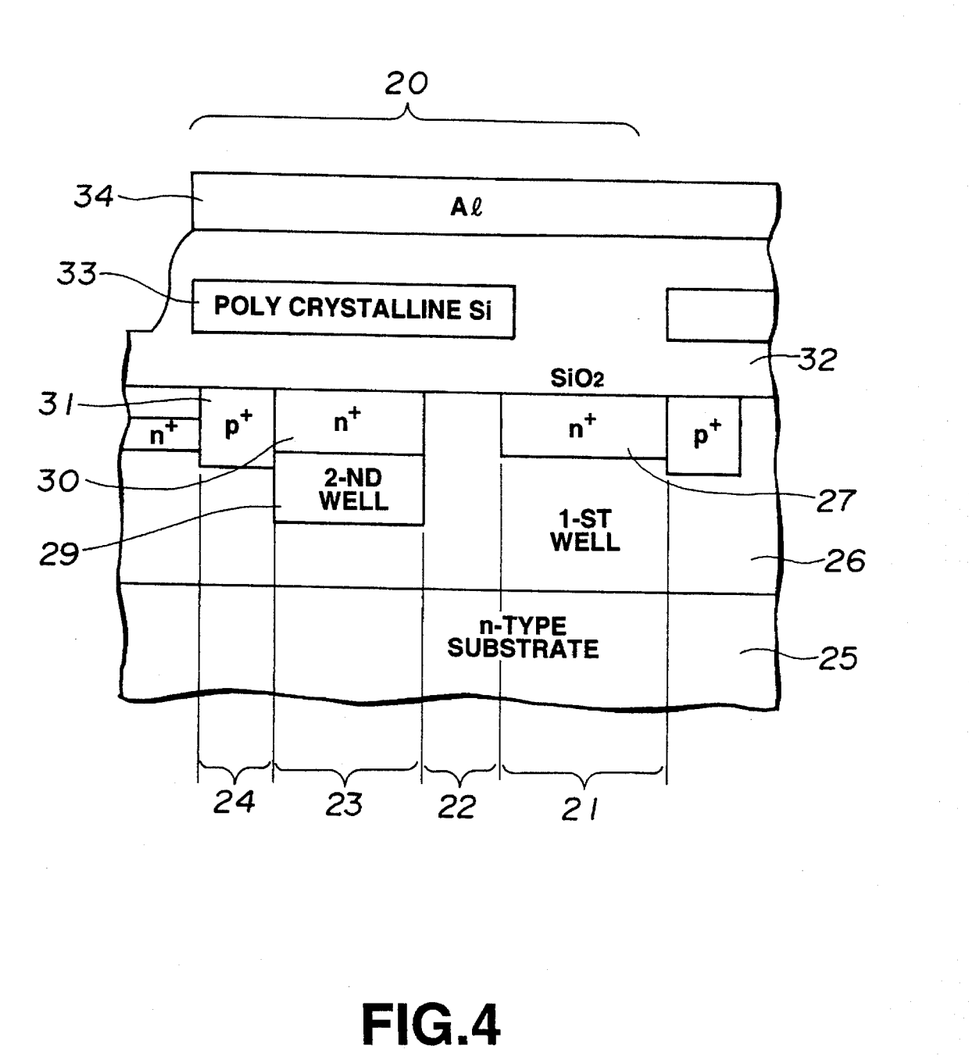
FIG. 4 is a schematic view of one embodiment of a reference pixel in the optical black region.

Pixels having the structure shown in FIG. 2 are disposed in the active pixel region 11 of FIG. 1 and pixels having a similar structure, but wherein the light shield, or Al layer 34, extends over sensor section 21, as shown in FIG. 3, are disposed in the optical black region 15. A pixel having the structure shown in FIG. 4 is used as the position reference pixel. Here, the positive hole storage layer 28 overlying the sensor section 21 of FIG. 3 is omitted and the $n^+$ region 27 extends to the $SiO_2$ insulating layer. As a result, the sensor section 21 of the pixel shown in FIG. 4 operates in a depleted state so that the dark current at this portion (horizontal and vertical position reference pixels 16H, 16V) is larger than the dark current at other portions of the optical black region. Consequently, a signal of a fixed level greater than the optical black level $V_{BK}$ is obtained; and this signal can be detected as the pixel position reference signal $R_H$.

Figure 5:
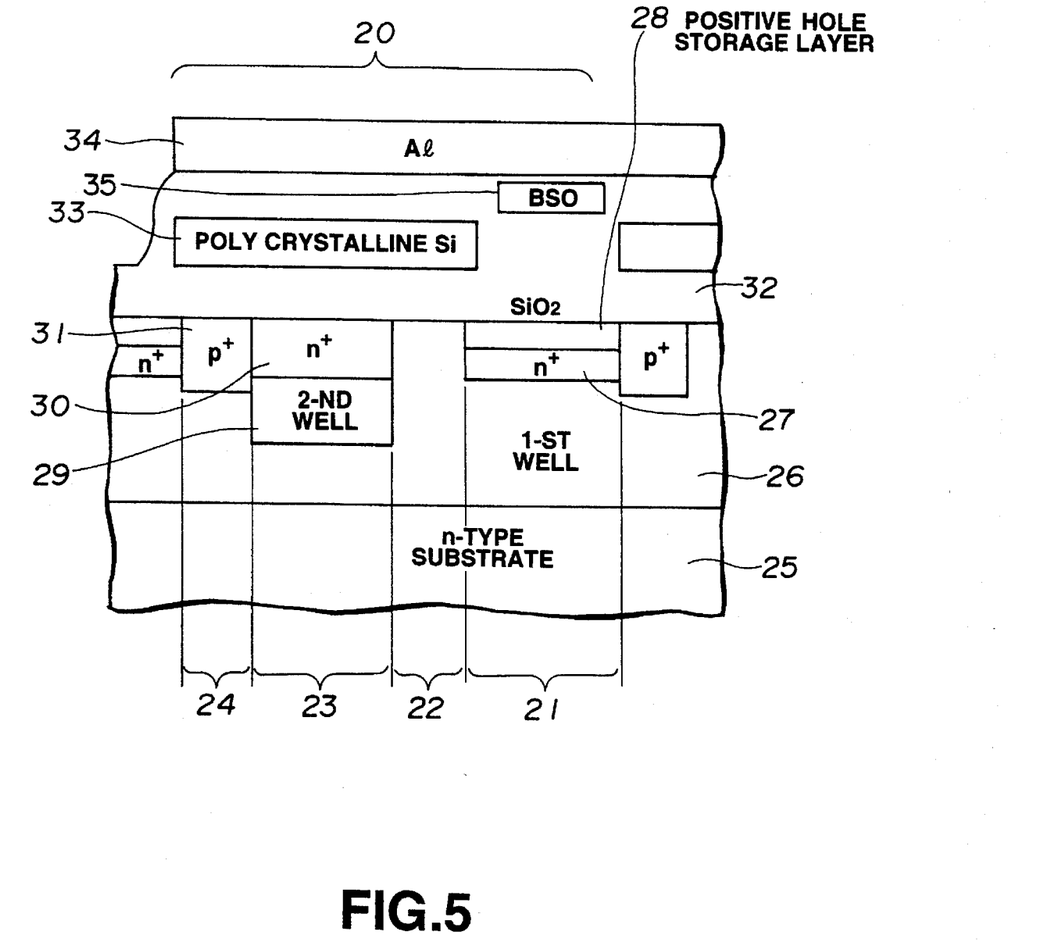
FIG. 5 is a schematic view of another embodiment of the reference pixel.

Yet another embodiment of a pixel structure which can be used as the position reference pixel is illustrated in FIG. 5. Here, the pixel structure used in the optical black region, and shown in FIG. 3, is modified by depositing in the $SiO_2$ insulating layer 32 a light-emitting element 35 formed of $Bi_{12}SiO_{20}$, generally referred to as a BSO chip. When a voltage is applied to the polycrystalline layer 33, the BSO chip is activated to emit light which passes through the transparent $SiO_2$ insulating layer to produce a current which results in a readily detectable level that is substantially greater than the optical black level $V_{BK}$. Thus, when the position reference pixel shown in FIG. 5 is scanned, the signal produced thereby is indicative of the scanning of horizontal position reference pixel 16H or vertical position reference pixel 16V, respectively.

It is readily appreciated that, since the position reference pixel having the structure shown in FIG. 4 or FIG. 5 produces an easily detectable signal, the occurrence of that signal as pixels in the optical black region are scanned results in a reference signal, such as the reference pulse $R_H$ shown in FIG. 1B, which can be used as a reference position from which any one of the active pixels located in active region 11 can be precisely identified. The manner in which the position reference pixel is used to identify pixels in the active region, and to accurately detect and compensate for a defective pixel now will be described in conjunction with the block diagram shown in FIG. 6.

Figure 6:
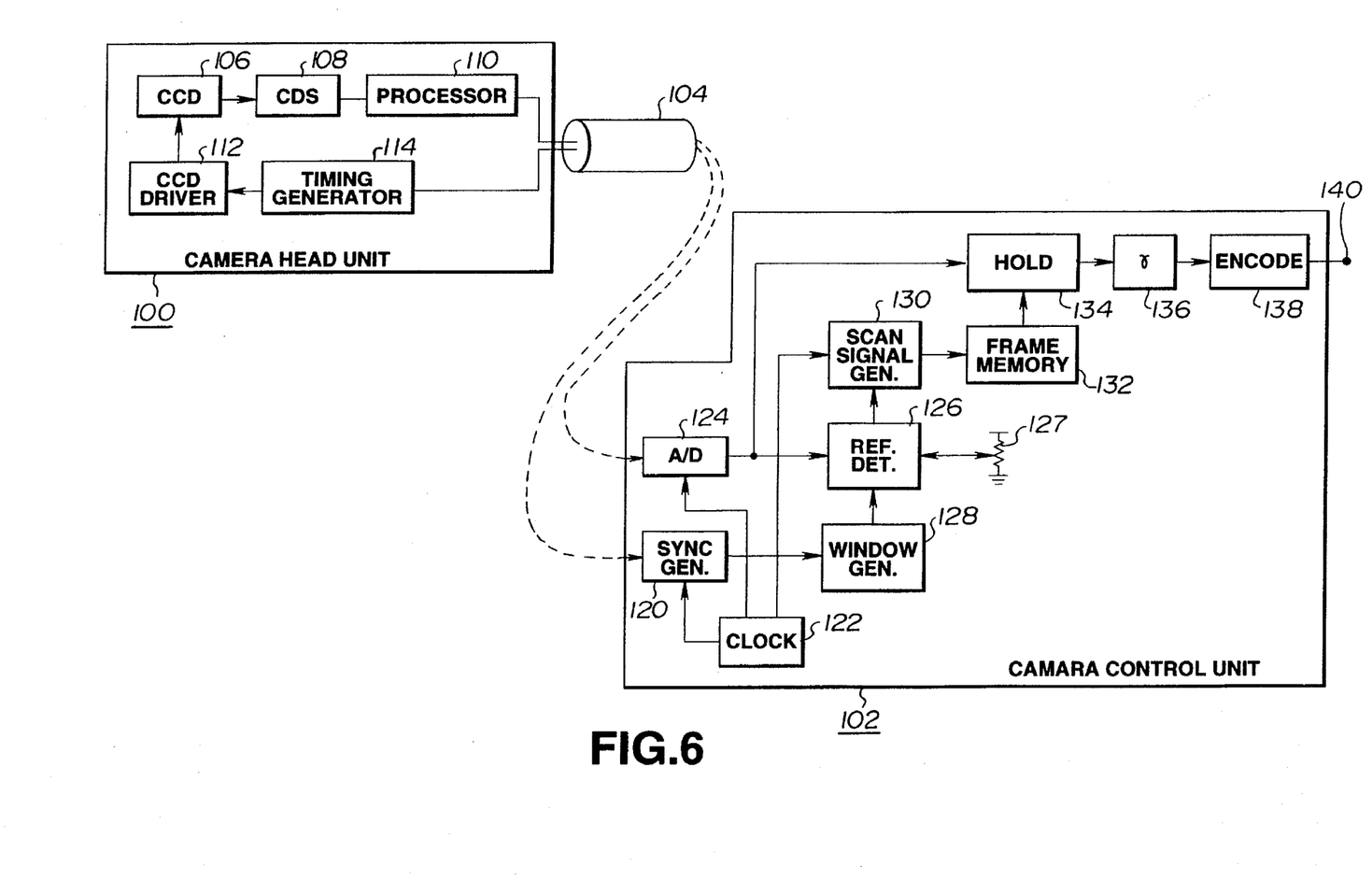
FIG. 6 is a block diagram of apparatus for detecting and compensating the image signal produced by a defective pixel.

FIG. 6 illustrates a non-self-contained video camera comprised of a camera head unit 100, a camera control unit 102 and a cable 104 which supplies image signals from the camera head unit to the camera control unit and also supplies synchronizing signals from the camera control unit to the camera head unit. The camera head unit includes a solid-state imaging device, illustrated herein as a CCD pickup 106 which may have the structure diagrammatically illustrated in FIG. 1A. It is appreciated, therefore, that CCD pickup 106 includes an array of active pixels disposed in an active region 11, an array of optical black pixels disposed in an optical black region 15 and position reference pixels 16H and 16V which may exhibit the structure shown in FIGS. 4 or 5. Camera head unit 100 additionally includes a sampling circuit 108, which may be a correlated double sampling (CDS) circuit, a sample signal processor 110, a CCD driver 112 and a timing generator 114. As shown, CCD pickup 106 is driven by CCD driver 112 which, in turn, operates to scan the active and optical black pixels included in the CCD pickup in response to timing signals supplied to the CCD driver by timing generator 114. The timing generator is, in turn, driven by synchronizing signals supplied thereto from camera control unit 102 via cable 104. In the illustrated embodiment, these synchronizing signals are generated in the camera control unit by a sync generator 120. It will be appreciated that, because of the length of cable 104, a time delay is imparted into the synchronizing signals supplied to timing generator 114 from sync generator 120. Thus, from the viewpoint of considering the synchronizing signal produced at the sync generator, there is a discrete time delay between that synchronizing signal and the reading of a corresponding pixel as that pixel is scanned by CCD driver 112.

Processor 110 functions to adjust the gain, black level, etc., of the sampled levels produced by each pixel as those pixels are scanned by CCD driver 112. Hence, and as is known to those of ordinary skill in the art, processor 110 produces suitably adjusted pixel image signals. These pixel image signals are supplied to camera control unit 102 over cable 104; and a further delay relative to the aforementioned synchronizing signal produced by sync generator 120 is introduced into the pixel image signal that eventually reaches the camera control unit.

The camera control unit includes an analog-to-digital (A/D) converter 124, a hold circuit 134, a gamma correction circuit 136 and an encoder 138. During normal operation, that is, if it is assumed that none of the active pixels included in CCD pickup 106 is defective, each pixel image signal supplied to the camera control unit is converted from analog form to digital form by A/D converter 124, and each digital pixel image signal then is gamma-corrected by gamma corrector 136 and suitably encoded by encoder 138. The resultant encoded image signals are provided at an output terminal 140. During such normal operation, hold circuit 134 provides no active function and simply supplies to gamma corrector 136 each digitized pixel image signal.

It is expected, however, that in manufacturing CCD pickup 106, one or more active pixels may be defective. That is, when light impinges upon a defective active pixel, the pixel signal produced thereby is not an accurate representation of the impinging light. In that event, rather than supply to output terminal 140 an error image signal, it is preferred simply to replace the erroneous signal produced by this defective pixel with the correct image signal produced by an adjacent efficacious pixel. For example, the pixel image signal produced by the preceding active pixel is used in place of the erroneous pixel image signal produced by the defective pixel. Hold circuit 134 thus operates to temporarily store, or hold, a pixel image signal for a time period substantially equal to the time needed to scan two successive pixels. As a result, the temporarily stored pixel image signal in hold circuit 134 is used once again in the event that the next pixel image signal is erroneous. Of course, if the next pixel image signal is correct, the temporarily stored preceding pixel image signal is not used. Rather, this next correct pixel image signal is supplied to gamma corrector 136. Hold circuit 134 is selectively operated, that is, it is selectively triggered to use once again the pixel image signal temporarily stored therein, by a frame memory 132.

Frame memory 132 stores a corresponding representation, or map, of all of the active and optical black pixels included in CCD pickup 106. Thus, the frame memory may be thought of as a memory device which stores an array of signals, or flags, corresponding to the pixel arrangement shown in FIG. 1A. Preferably, frame memory 132 stores a "0" at those locations corresponding to non-defective pixels, specifically non-defective active pixels, and stores a "1" at those locations corresponding to defective active pixels. For convenience, each "1" may be thought of as a flag that is set and each "0" may be thought of as a flag that is reset. It is known to test all of the active pixels one-at-a-time during the manufacturing of CCD pickup 106. As a result of such testing, each non-defective active pixel is known and each defective active pixel likewise is known. That is, the location, or coordinate, of each defective pixel is known and its corresponding location in frame memory 132 is loaded with a flag, or "1", which represents that such active pixel is defective. Thus, when a pixel image signal produced by a defective pixel is supplied to camera control unit 102, frame memory 132, which stores the location of that defective pixel and, thus, senses when the pixel image signal supplied to the camera control unit is from that defective pixel, energizes hold circuit 134 to supply to gamma corrector 136 the temporarily stored pixel image signal that had been produced by the preceding non-defective pixel.

Typically, frame memory 132 is addressed by a scan signal generator 130 which, in turn, is driven by a clock generator 122. This clock generator also drives A/D converter 124 and sync generator 120. The scan signal generator thus is expected to be driven in synchronism with sync generator 120 which, in turn, is expected to synchronize the scanning of CCD pickup 106 by CCD driver 112. As a result, when pixel 1 supplies a pixel image signal to camera control unit 102, scan signal generator 130 is expected to generate an address for frame memory 132 which corresponds to the location therein of pixel 1. Likewise, when the pixel image signal produced by pixel 2 is supplied to the camera control unit, scan signal generator 130 is expected to address memory 132 representing the location therein corresponding to pixel 2. As a result of this addressing, it is expected that when the image signal produced by pixel n is supplied to the camera control unit, a corresponding location in frame memory 132 is addressed. If that corresponding location has a "1" flag stored therein, thus representing that pixel n is defective, hold circuit 134 is triggered and the otherwise erroneous pixel image signal is compensated by replacing that pixel image signal with the previous correct pixel image signal. However, as a result of the aforementioned delay imparted to the synchronizing signal supplied from sync generator 120 to timing generator 114 and the further delay imparted to the pixel image signal supplied to A/D converter 124 from processor 110, it is possible and even likely that, when the pixel image signal produced by pixel n is received by the camera control unit, scan signal generator 130 addresses a location in memory 132 corresponding to pixel (n–1). It will be appreciated, therefore, that because of this delay, an erroneous pixel image signal may, nevertheless, be supplied to gamma corrector 136 and the next-following correct pixel image signal may be replaced by the preceding erroneous signal.

This possible erroneous defective pixel compensation operation is avoided by the present invention which serves to reset, or preset, scan signal generator 130 to generate a predetermined memory address when position reference pixel 16H or 16V is scanned. This presetting of the scan signal generator is achieved by a reference detector 126 and a window generator 128, as will now be described.

Reference detector 126 may be a comparator supplied with a reference signal, diagrammatically represented as being supplied by a reference source 127, and is adapted to compare to this reference signal the digitized pixel image signals produced by A/D converter 124. Reference detector 126 is enabled by window generator 128, the latter being driven by sync generator 120. It will be appreciated that the delay attributed to cable 104 is no greater than the time needed to scan one, two or three successive pixels of CCD pickup 106. Thus, window generator 128 operates to generate a window pulse having a duration equal to the greatest delay imparted by cable 104 such that this window sufficiently surrounds the scanning of position reference pixel 16H. The window generator also may be driven by sync generator 120 to generate another window pulse which effectively surrounds the scanning of reference position pixel 16V. It will be recognized that suitable timing is used in window generator 128 to respond to the synchronizing signal produced by sync generator 120 to generate the aforementioned window pulses. Such timing will be readily and easily implemented by one of ordinary skill in the art. Thus, even with the expected but unpredictable delay attributed to cable 104, window generator 128 generates a window pulse when the pixel image signal produced by reference position pixel 16H is supplied to the camera control unit and also generates a window pulse when the pixel image signal produced by reference position pixel 16V is supplied to the camera control unit.

Since the reference position pixels assume the structure shown in FIG. 4 or FIG. 5, thus producing a reference pixel image signal of the type shown as reference pulse $R_H$ in FIG. 1B, reference detector 126 readily detects the occurrence of this reference pulse within the window generated by window generator 128. For example, the reference signal supplied to the reference detector by reference source 127 may be a threshold level greater than the black level $V_{BK}$, but less than the expected level of the reference pulse $R_H$. Consequently, when reference position pixel 16H is scanned, reference detector 126 presets scan signal generator 130 to an address corresponding to this reference position pixel, thereby addressing memory 132 at a location which also corresponds to this reference position pixel. Thereafter, the scan signal generator may be incremented by clock generator 122 to generate successive addresses for frame memory 132; and it will be readily appreciated that such successive addresses now are in synchronism with the pixel image signals supplied to camera control unit 102 by the corresponding pixels of CCD pickup 106. Likewise, the detection of the pixel image signal produced by position reference pixel 16V presets scan signal generator 130 to address a location in memory 132 which corresponds to this reference position pixel.

Therefore, even though cable 104 may impart a delay to the pixel image signals supplied to the camera control unit relative to the clock signals produced by clock generator 122, and even though this delay may not be accurately predictable, nevertheless the detection of the pixel image signals produced by the position reference pixels serves to synchronize the addressing of memory 132 with the reception of the pixel image signals produced by the active pixels, thereby permitting proper compensation when a defective pixel is scanned.

While the present invention has been particularly shown and described with reference to preferred embodiments, it will be readily appreciated by those of ordinary skill in the art that various changes may be made. For example, only a single reference position pixel can be used or, alternatively, three or more reference position pixels can be provided in the optical black region. Of course, the coordinates of the respective reference position pixels will be set when the CCD pickup is manufactured, and these coordinates are represented by the presetting of scan signal generator 130 when the corresponding reference position pixel is detected.

It also is contemplated that the reference position pixel need not be limited to the embodiment shown in FIG. 4 or the embodiment shown in FIG. 5. Rather, the reference position pixel may adopt the very same structure as the active pixel shown in FIG. 2. With this construction, the reference position pixel produces an output signal whose level is equal to that shown in FIG. 1B during the active scanning period $T_A$, and this output signal is produced as a result of light impinging upon the reference position pixel.

It is intended that the appended claims be interpreted so as to cover the embodiments discussed above, those changes which have been mentioned and all equivalents thereto.

What is claimed is:

1. A solid-state imaging apparatus for producing an image signal, comprising:

an active pixel region comprised of a plurality of active light receiving pixels for converting incident light to an image signal, said active pixel region having a peripheral portion; and an optical black region disposed at said peripheral portion of said active pixel region and comprised of a plurality of pixels having a surface provided with a light shield, at least one of the pixels in said optical black region having an opening in said light shield for the passage of light, said at least one pixel being located at a predetermined position within said optical black region, to produce a reference position signal detectable relative to signals produced by the remaining pixels in said optical black region.

2. A solid-state imaging apparatus for producing an image signal, comprising:

an active pixel region comprised of a plurality of active light receiving pixels for converting incident light to an image signal, said active pixel region having a peripheral portion;

an optical black region disposed at said peripheral portion of said active pixel region and comprised of a plurality of pixels having a surface provided with a light shield; and a predetermined one of the pixels in said optical black region having a sensor section, an insulating layer separating said sensor section from said light shield, and light emitting means positioned in said insulating layer between said light shield and said sensor section to irradiate light to said sensor section to produce a reference position signal detectable relative to signals produced by the remaining pixels in said optical black region.

3. A solid-state imaging apparatus for producing an image signal, comprising:

an active pixel region comprised of a plurality of active light receiving pixels for converting incident light to an image signal, said active pixel region having a peripheral portion; and an optical black region disposed at said peripheral portion of said active pixel region and comprised of a plurality of pixels each having a surface provided with a light shield, a sensor section and a positive hole storage layer overlying said sensor section to minimize dark current reproduced by said pixel; and wherein at least one predetermined pixel in said optical black region having said positive hole storage layer omitted therefrom to produce a dark current of a magnitude greater than said minimized dark current, thereby producing a reference position signal detectable relative to signals produced by the remaining pixels in said optical black region.

4. A solid state imaging apparatus, comprising:

an active pixel region comprised of a plurality of active light receiving pixels for converting incident light to an image signal, each active pixel having a structure which includes a sensor section and an insulating layer overlying said sensor section; and an optical black region disposed adjacent said active pixel region, said optical black region being comprised of a plurality of optically black pixels for producing a black signal level, each optical black pixel having a structure substantially similar to the structure of said active pixel and additionally including a light shield provided on a surface thereof and overlying said sensor section, said optical black region being additionally comprised of at least one position reference pixel located at a predetermined position in said optical black region and having a structure which differs from the structure of said optical black pixels to produce a reference position signal detectable relative to signals produced by said optical black pixels.

5. The apparatus of claim 4 wherein said position reference pixel includes a p-well region, an insulating layer overlying said p-well region, a light shield overlying said insulating layer, a sensor section disposed in said p-well region, and a light transmissive opening in said light shield overlying said sensor section.

6. The apparatus of claim 4 wherein said position reference pixel includes a p-well region, an insulating layer overlying said p-well region, a light shield overlying said insulating layer, a sensor section disposed in said p-well region, and a light emitting element in said insulating layer between said light shield and said sensor section to irradiate light to said sensor section.

7. The apparatus of claim 4 wherein each optical black pixel includes a position hole storage area included in said sensor section to suppress dark current produced by said active pixel; and wherein said position reference pixel includes a p-well region, an insulating layer overlying said p-well region, a light shield overlying said insulating layer and a sensor section disposed in said p-well region, said sensor section omitting a positive hole storage area to increase the dark current produced by said position reference pixel.

* * * * *